United States Patent [19]
Kishikawa et al.

[11] Patent Number: 5,885,852
[45] Date of Patent: Mar. 23, 1999

[54] PACKAGED SEMICONDUCTOR DEVICE HAVING A FLANGE AT ITS SIDE SURFACE AND ITS MANUFACTURING METHOD

[75] Inventors: Norio Kishikawa, Ome; Ikuo Yoshida, Musashimurayama; Tetsuya Hayashida, Tokyo, all of Japan

[73] Assignee: Hitachi, Ltd., Tokyo, Japan

[21] Appl. No.: 848,566

[22] Filed: Apr. 28, 1997

Related U.S. Application Data

[63] Continuation of Ser. No. 350,607, Dec. 7, 1994, abandoned.

[30] Foreign Application Priority Data

Dec. 10, 1993 [JP] Japan ..................................... 5-310845

[51] Int. Cl.$^6$ .............................. H01L 21/56; H01L 21/60
[52] U.S. Cl. .......................... 458/117; 438/123; 438/124; 438/126; 257/667; 257/671; 257/787
[58] Field of Search ..................................... 438/117, 123, 438/124, 126; 264/272.17; 437/214, 215, 217, 219, 220; 257/667, 671, 787

[56] References Cited

FOREIGN PATENT DOCUMENTS

| A-0538010 | 4/1993 | European Pat. Off. . |
| A-61-51933 | 3/1986 | Japan . |
| A-2-45961 | 2/1990 | Japan . |
| A-2-280360 | 11/1990 | Japan . |
| A-3-194956 | 8/1991 | Japan . |
| A-5-136310 | 6/1993 | Japan . |
| A-5-226552 | 9/1993 | Japan . |

*Primary Examiner*—David Graybill
*Attorney, Agent, or Firm*—Antonelli, Terry, Stout & Kraus, LLP

[57] ABSTRACT

For manufacturing a packaged semiconductor device, a lead frame with an electrically insulating strip member and a semiconductor chip is placed in a molding unit having upper and lower dies. The upper and lower dies have recessed areas for determining a size of a cavity of the molding unit different from each other, the size of the cavity being measured in a direction perpendicular to a clamping motion direction of the dies. The lead frame is positioned so that a surface of each lead with the insulating strip member applied thereto is contacted with one of the upper and lower dies having a larger recessed area and a molding line of the molding unit intersects the insulating strip member. The molding unit is closed to clamp the lead frame to depress and thrust into spaces between adjacent leads that part of the strip member which is outside the molding line and to form the cavity of the molding unit. By injecting a molding material into the cavity, a molding package is provided encapsulating the semiconductor chip and a portion of each lead. The packaged semiconductor device has a flanged side surface with an insulating strip provided between a step of the flanged side surface and intermediate portions of the leads which are between first portions of the leads encapsulated in the molding package and second portions of the leads protruding from the flanged side surface.

13 Claims, 9 Drawing Sheets

FIG. 14

PACKAGED SEMICONDUCTOR DEVICE HAVING A FLANGE AT ITS SIDE SURFACE AND ITS MANUFACTURING METHOD

This application is a Continuation application of application Ser. No. 08/350,607, filed Dec. 7, 1994, abandoned.

BACKGROUND OF THE INVENTION

The present invention relates to a packaged semiconductor device and techniques for manufacturing same and in particular to techniques useful when applied to an LSI package having numerous pins or a small pin arrangement pitch such as a QFP (Quad Flat Package).

Dam bars are disposed in a lead frame used for fabricating an LSI package. A dam bar is a member disposed in an intermediate portion of each lead of the lead frame so as to couple leads adjacent to each other and has a function to prevent molten resin injected into a molding unit from flowing out to the exterior of the molding unit through spaces between different leads, when a semiconductor chip mounted on the lead frame is molded with resin. It has further a function to act as a supporting member for preventing deformation of the leads. The dam bars are cut away by means of a cutting tool such as a press, etc., after the semiconductor chip has been molded with resin.

However, recently, for lead frames used for fabricating LSI packages involving numerous pins, since an increase in the number of pins or leads and a decrease in the pin arrangement pitch are advanced rapidly, it becomes more and more difficult to cut the dam bars by means of a press.

Therefore, in lieu of a lead frame in which dam bars and leads are formed in one body from a metal plate, so-called tape dam techniques have been proposed (JP-A-58-28841, published on Feb. 19, 1983) in which a thin insulating tape is applied to a lead frame having no dam bars, and the tape is pressed between different leads in a resin molding operation to use the pressed parts of the insulating tape as dam bars. According to these tape dam techniques, since the tape is made of an insulating material, dam cut after the resin molding is unnecessary and thus it is possible to increase the number of pins or leads and to decrease the pin arrangement pitch.

Techniques similar to the tape dam techniques are disclosed also in U.S. Ser. No. 08/161,374 filed on Dec. 2, 1993 and U.S. Pat. No. 5,106,784 issued on Apr. 21, 1992.

SUMMARY OF THE INVENTION

Figure 1:
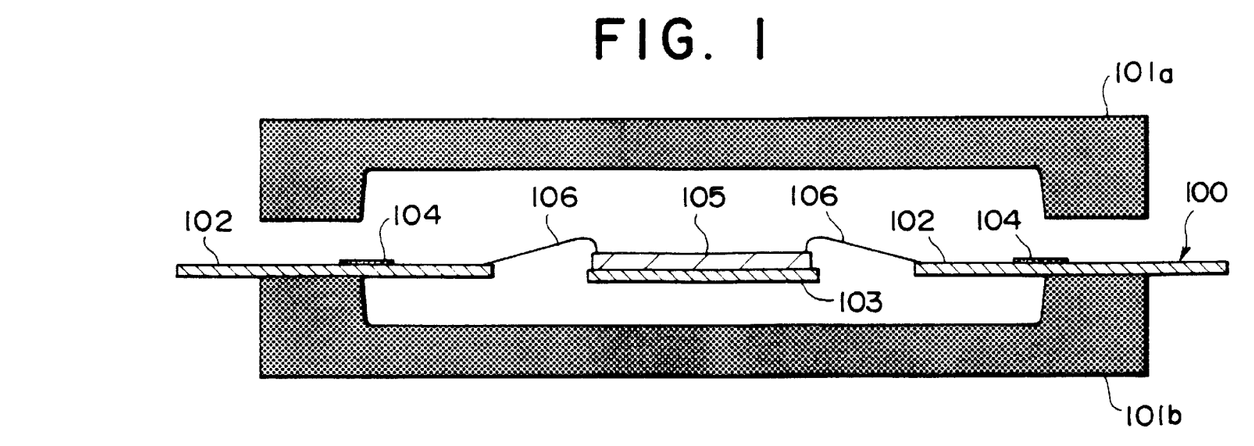
FIGS. 1 and 2 are cross-sectional views of a lead frame showing a method of manufacturing a packaged semiconductor device, which the inventors have studied.
Figure 2:
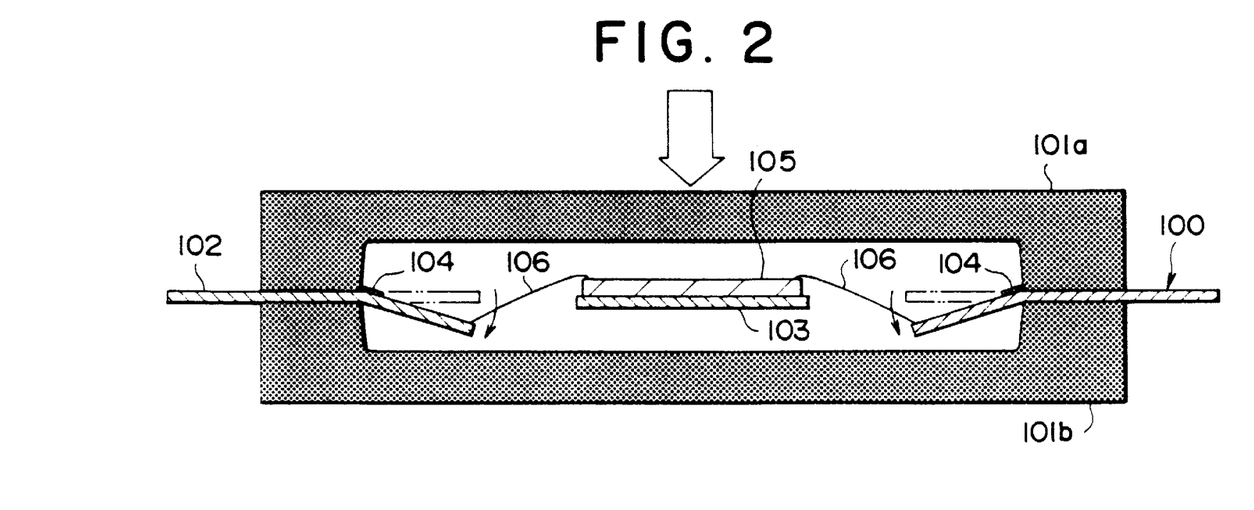

The present invention is based on knowledge of the inventors thereof which will be described with respect to FIGS. 1 and 2. Therefore, the structures themselves indicated in FIGS. 1 and 2 are not known. FIG. 1 shows a state, in which a lead frame 100 provided with tape dams studied by the inventors is mounted on a molding unit.

A molding unit includes an upper die 101a and a lower die 101b and the lead frame 100 is positioned on the upper surface of the lower die 101b. The lead frame 100 includes leads 102 and a die pad portion 103. A thin dam tape 104 made of an insulating material such as polyimide resin is bonded to a part of one of surfaces of the leads 102 of the lead frame 100 by means of an adhesive. A semiconductor chip 105 bonded to the upper surface of the die pad portion 103 is connected electrically with leads 102 through bonding wires 106.

In order to mold the semiconductor chip 105 with resin, the upper die 101a and the lower die 101b are brought closely into contact with each other and clamped. Then, the dam tape 104 applied to the one surface (upper surface in the example indicated in FIG. 1) of the lead frame 100 is placed between the upper die 101a and the lower die 101b to be crushed so that spaces between different leads 102 are filled with a part thereof to form a dam.

Next, molten resin is injected into a cavity of the molding unit to encapsulate the semiconductor chip 105. At this time, since the spaces between adjacent leads 102 are filled with a part of the insulating tape 104 to form a dam, molten resin will not flow out to the exterior of the molding unit through these spaces.

Thereafter, the lead frame 100 is taken out from the molding unit and the leads 102 are subjected to solder plating treatment. Further, unnecessary parts of the lead frame 100 are cut away by means of a press and thereafter, an LSI package is completed by bending the leads 102 in a predetermined form.

In the molding unit for fabricating an LSI package such as represented by QFP, the upper die 101a and the lower die 101b are symmetric, as indicated in FIG. 1.

It has been found that when the lead frame 100, to one of the surfaces of which the dam tape is applied, is mounted on such a molding unit to be clamped, since the lower surface of a boundary portion between the inner lead and outer lead portions of the leads 102 is clamped directly by the lower die while the upper surface of the boundary portion is clamped by the upper die 101a through the dam tape 104, the inner lead portions of the leads 102 are bent in the (downward) direction opposite to the surface to which the dam tape is applied, as indicated in FIG. 2. It has been also found that, in case where the dam tape is applied to the lower surface of the lead frame, the leads are bent upward.

As a result, the bonding wires 106 connecting the semiconductor chip 105 with the leads 102 are deformed (the wire twist being twisted), which gives rise to mold deficiency such as wire shorting and inclination of the die pad portion 103 (and of the semiconductor chip 105).

In this case, if dam tapes 104 were applied to both surfaces of the lead frames 100, since load would be applied equally both upward and downward to the boundary portions of the leads 102, no bending of the inner lead portions would be produced. However, by this method, since the insulating tapes 104 are inserted by a press or the like into the spaces between different leads in the directions both upward and downward at clamping in the molding unit, for a lead frame 100 having a small arrangement pitch, leads are deformed in the transversal direction to widen spaces therebetween.

An object of the present invention is to provide techniques capable of efficiently preventing bending of the inner leads at clamping of the lead frame provided with dam tape with the molding unit.

According to one aspect of the present invention, for manufacturing a packaged semiconductor device, a lead frame with an electrically insulating strip member and a semiconductor chip is placed in a molding unit having upper and lower dies. The upper and lower dies have recessed areas for determining a size of a cavity of the molding unit different from each other, the size of the cavity being measured in a direction perpendicular to a clamping motion direction of the dies. The lead frame is positioned so that a surface of each lead with the insulating strip member applied thereto is contacted with one of the upper and lower dies having a larger recessed area and a molding line of the molding unit intersects the insulating strip member. The molding unit is closed to clamp the lead frame to depress and thrust into spaces between adjacent leads that part of the strip member which is outside the molding line and to form the cavity of the molding unit. By injecting a molding material into the cavity, a molding package is provided encapsulating the semiconductor chip and a portion of each lead.

According to another aspect of the present invention, a packaged semiconductor device has a flanged side surface with an electrically insulating strip provided between a step of the flanged side surface and intermediate portions of the leads which are between first portions of the leads encapsulated in the molding package and second portions of the leads protruding from the flanged side surface. An insulating filler of the same material as that of the insulating strip is provided in spaces between those parts of the second portions of the leads which outwardly adjoin the intermediate portions of the leads.

According to another aspect of the present invention, in a method of manufacturing a packaged semiconductor device, a molding unit having recessed areas different from each other, which determine the size of the cavity of the molding unit, is used for molding a semiconductor chip mounted on a lead frame having a dam tape applied thereto.

When the lead frame mounted on the molding unit is clamped by the upper die and the lower die, at the boundary portion between the outer lead portion and the inner lead portion of each of the leads, one of the main surfaces thereof is clamped by the lower die, while the other main surface is clamped by the upper die through a soft dam tape.

Owing to the fact that the recessed areas determining the size of the cavity of the molding unit are different for the upper die and the lower die, since positional deviations or displacement takes place between end portions of inner side walls of the upper die and end portions of inner side walls of the lower die, it is possible to prevent the inner lead portions of the leads (those parts of the leads which are encapsulated in a mold package) from bending in an upward direction or a downward direction.

DESCRIPTION OF THE PREFERRED EMBODIMENTS

Figure 3:
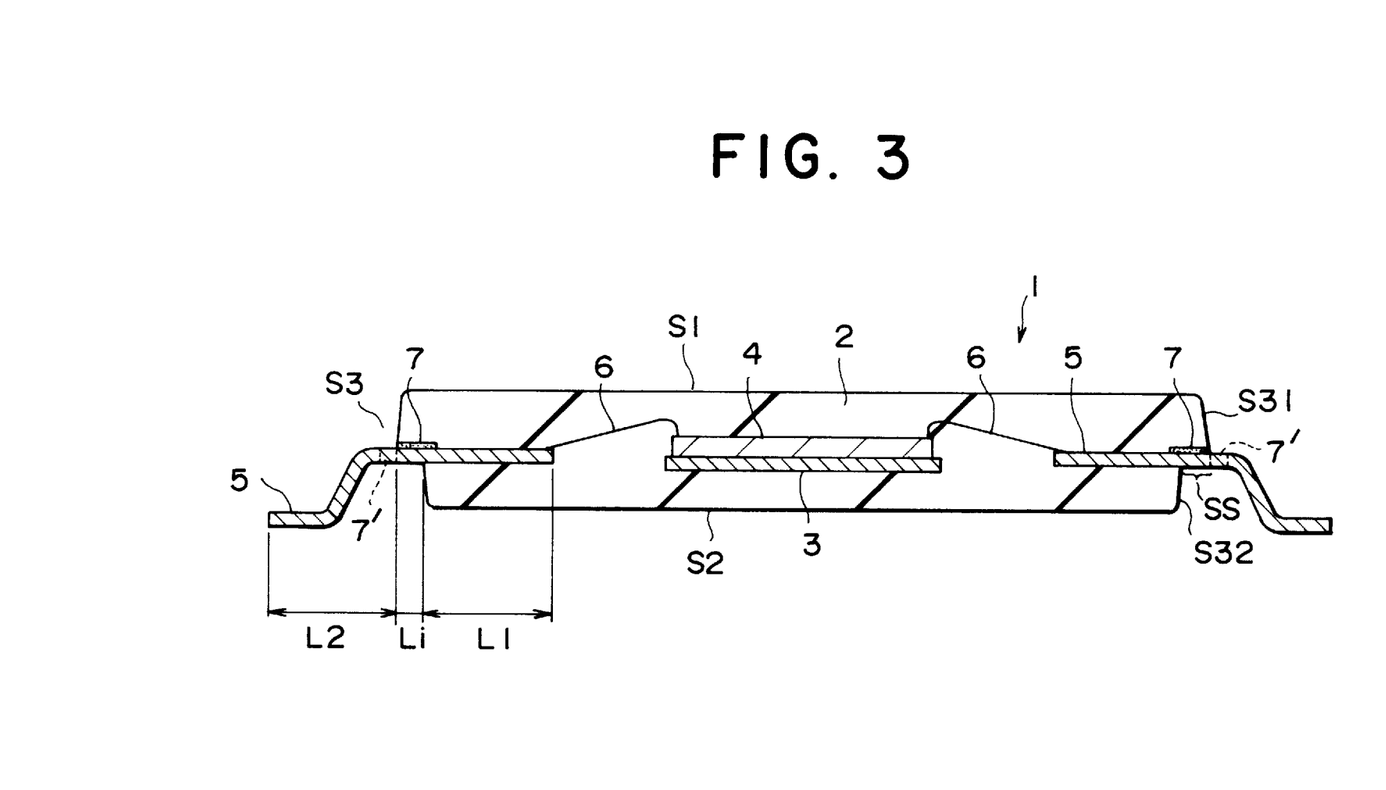
FIG. 3 is a cross-sectional view of a packaged semiconductor device according to an embodiment of the present invention.

FIG. 3 is a cross-sectional view of a QFP-type packaged semiconductor device encapsulated with a molding resin (hereinbelow called QFP for the sake of simplicity), which is an embodiment of the present invention. A molding package 2, e.g., made of epoxy resin has two main surfaces S1 and S2 opposite to each other and a flanged side surface S3 and a die pad 3, a semiconductor chip 4, e.g., made of a silicon single crystal, and inner lead portions (first portions) L1 of a plurality of slender leads 5 are encapsulated therein. The semiconductor chip 4 is bonded to the die pad 3 by means of an adhesive, e.g., made of epoxy resin. The inner lead portions L1 of the leads 5 are connected electrically with the semiconductor chip 4 through bonding wires 6 made of Au, Cu or Al. The flanged side surface S3 of the molding package 2 has a first side surface portion S31 adjoining the main surface S1, a side surface portion S32 adjoining the main surface S2, and a step portion SS connecting them.

An electrically insulating strip 7 is disposed between the upper surface of intermediate portions Li (portions between the inner lead portions L1 and the outer lead portions, i.e. second portions, L2) of the leads 5 and the molding package 2, and an electrically insulating filling material or a filler 7' exposed to the exterior of the package 2 is disposed between those parts of the outer lead portions L2 which adjoin the intermediate portions Li of the leads 5. This strip 7 is made of a thin tape of an insulating material such as polyimide resin and bonded to the upper surface of the leads 5 by means of an adhesive. The filling material or filler 7' is made of the same material as the strip 7. The lower surface of the intermediate portions Li of the leads 5 is not covered by the package 2.

As indicated in FIG. 3, in the QFP 1 of the present embodiment, outer sizes of the molding package 2 are different on the upper side and the lower side of the leads 5. More specifically, in this package 2, the outer size on the upper side of the leads 5, to which the insulating strip 7 is applied, is greater than the outer size on the lower side of the leads. That is, the first side surface portion S31 is outward with respect to the second side surface portion S32.

The QFP 1 may be manufactured by a method described below.

Figure 4:
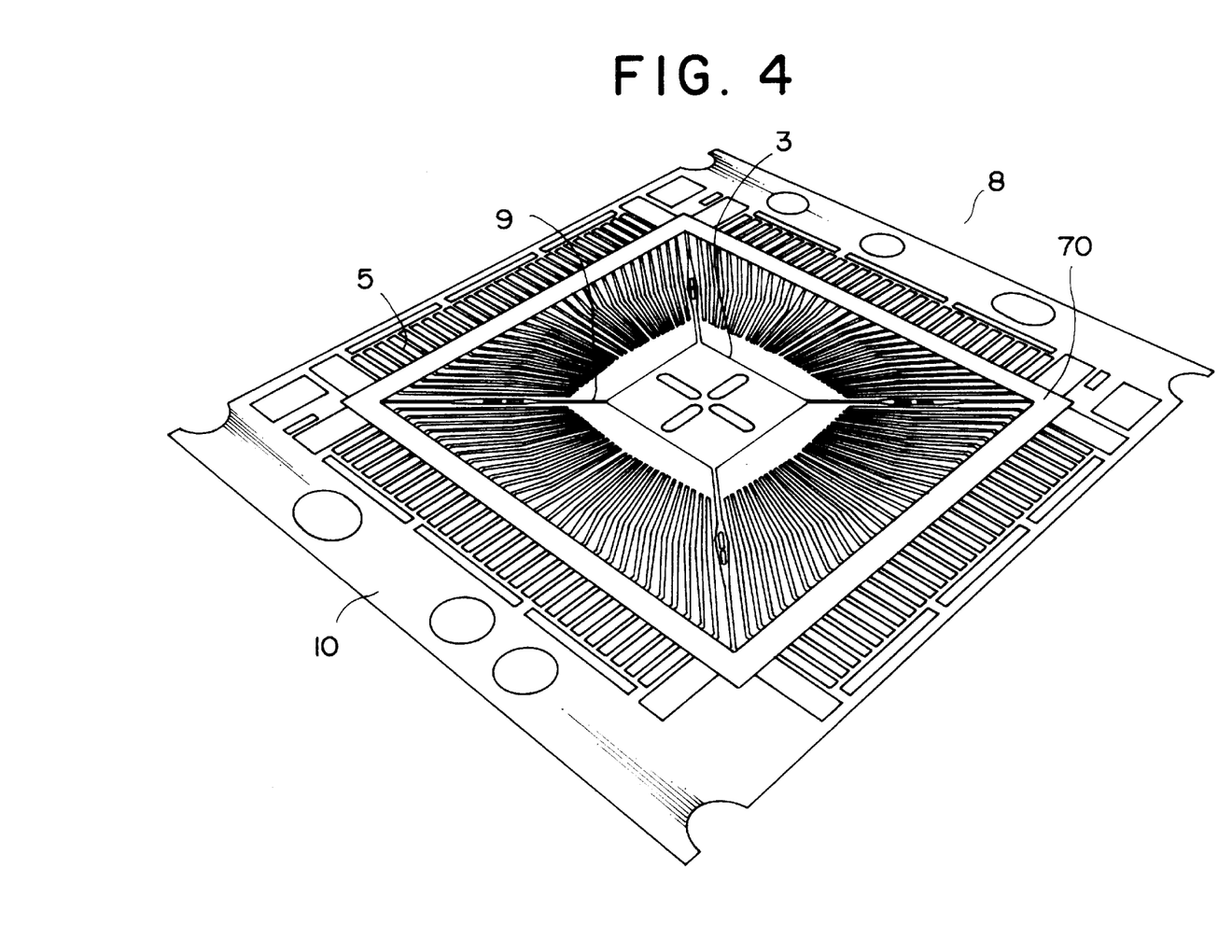
FIGS. 4 to 6 are perspective views of a lead frame at several stages in a method for manufacturing a packaged semiconductor device according to an embodiment of the present invention.

At first, a lead frame 8 as indicated in FIG. 4 is prepared. This lead frame 8 includes a die pad 3, supporting leads 9, each of which is disposed at each corner of the die pad 3 to support it, a plurality of slender leads 5 arranged around the die pad 3, a strip member 70 such as a rectangular frame-shaped dam tape applied to one surface of the leads 5 of the lead frame 8 in a direction approximately perpendicular to the length directions of the leads, and an outer frame 10 supporting the leads 5 and the supporting leads 9. The lead frame 8 is made of a metal such as 42 alloy or Cu and the different members such as the die pad 3, the leads 5, the supporting leads 9, the outer frame 10, etc. are formed in one body by a press or etching.

As an example, the lead frame 8 is about 0.1 mm thick, the inner lead portions of the leads 2 are about 0.13 mm wide, and the arrangement pitch of the inner lead portions is about 0.3 mm. On the other hand, the dam tape 70 is about 50 μm thick and about 0.5–2.0 mm wide, while the adhesive layer bonding the dam tape 70 to the leads 5 is about 25 μm thick.

Figure 5:
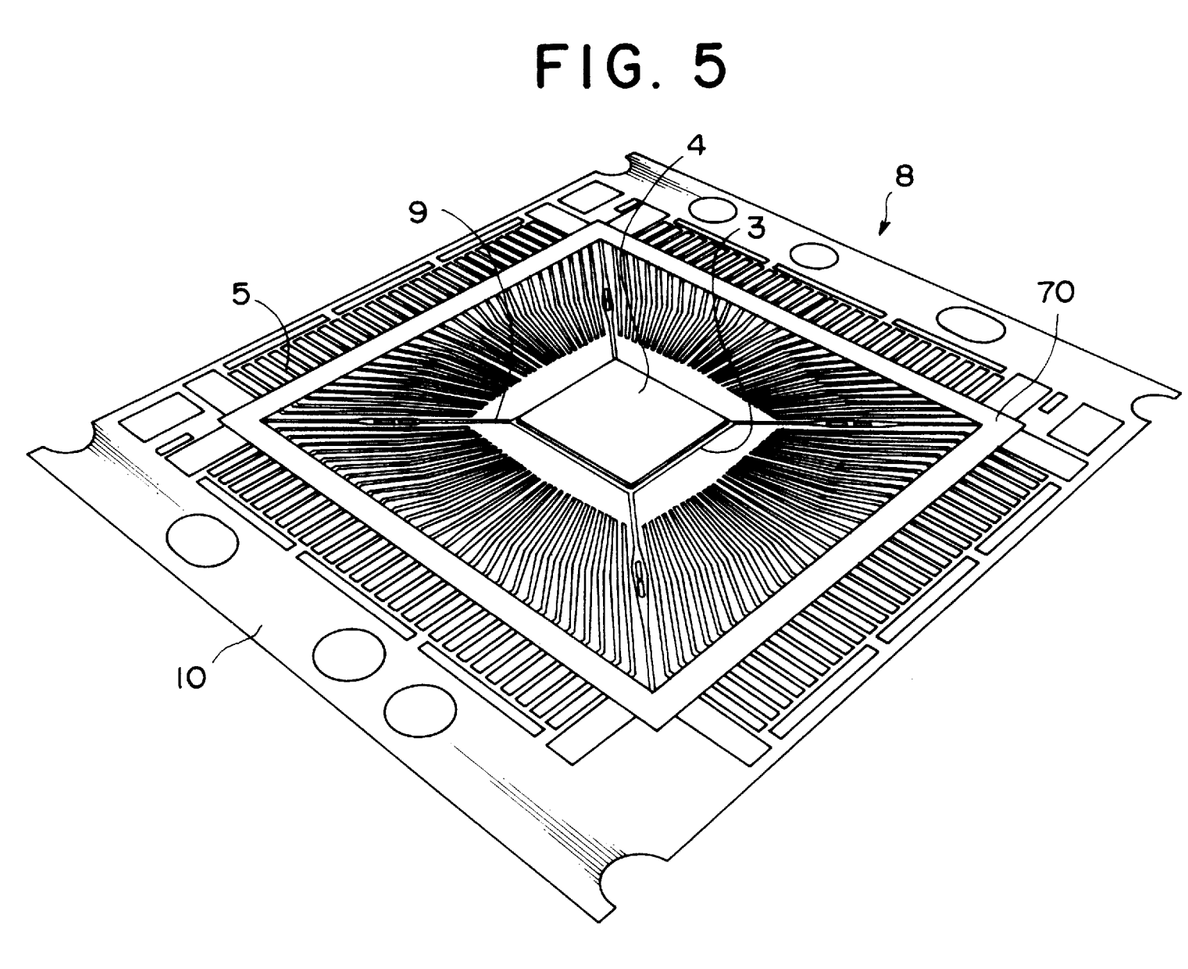
Figure 6:
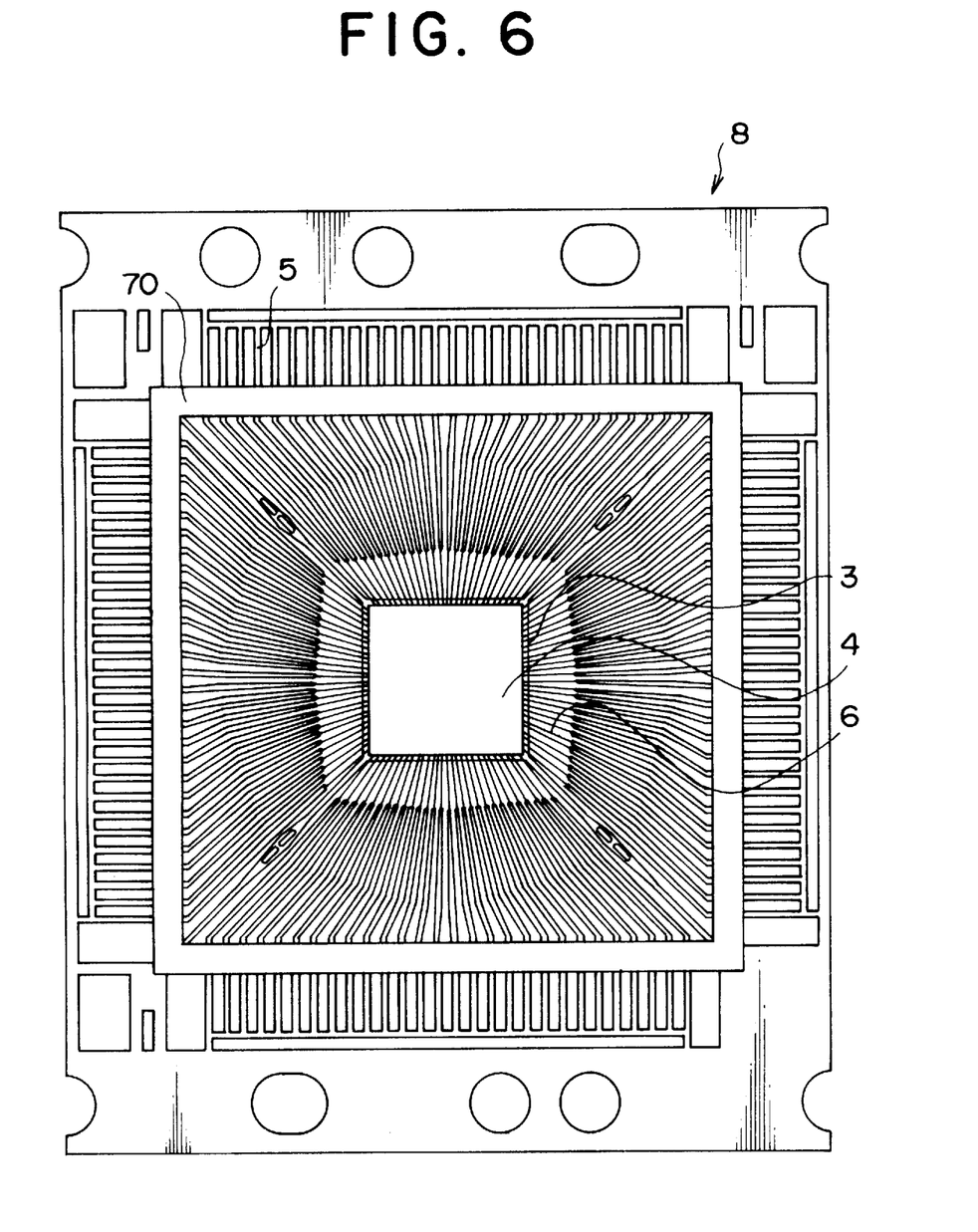

Subsequently, as indicated in FIG. 5, the semiconductor chip 4 is bonded to the die pad 3 of the lead frame 8 (pellet bonding) and then as indicated in FIG. 6, the leads 5 are connected electrically with the semiconductor chip 4 through bonding wires 6.

Figure 7:
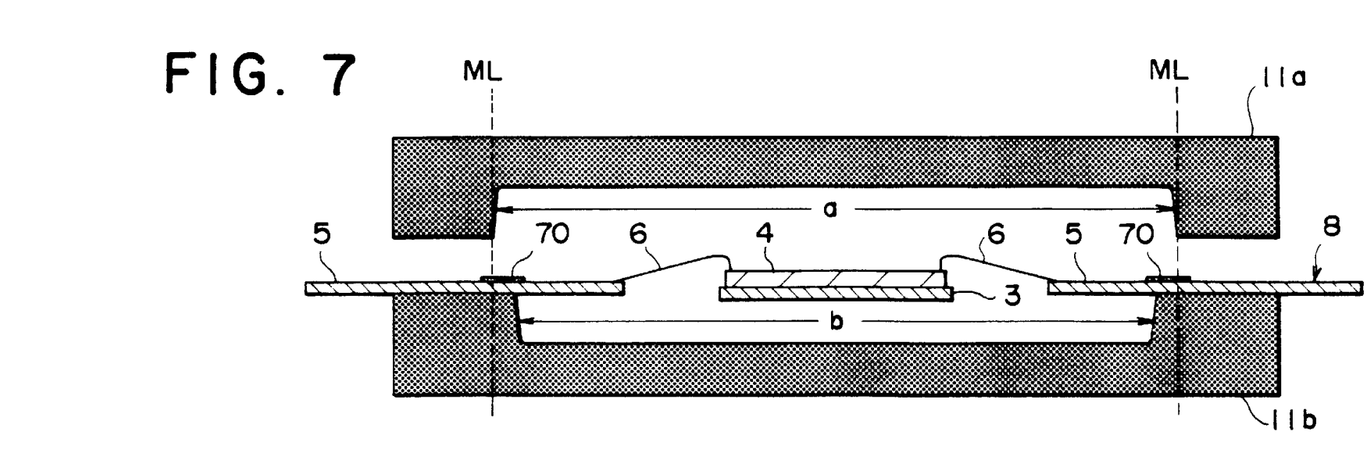
FIG. 7 is a cross-sectional view of a lead frame placed in a molding unit by a method of manufacturing the packaged semiconductor device according to an embodiment of the present invention.

Next, as indicated in FIG. 7, the lead frame 8 is mounted on a molding unit. This molding unit includes a pair of dies, i.e., an upper die 11a and a lower die 11b, and the lead frame 8 is positioned on the upper surface of the lower die 11b. At this time, the dam tape 70 applied to the upper surface of the leads 5 is in such a positional relation that it intersects a molding line ML of the molding unit.

As indicated in the same figure, recessed areas of the upper die 11a and the lower die 11b determining the size of a cavity in this molding unit are different from each other. More specifically, the size (a) of the recessed area of one of the dies of the molding unit, which faces the surface of the lead frame 8, to which the dam tape 70 is applied, namely, the upper die 11a in FIG. 7, is greater than the corresponding size (b) of the lower die 11b. The size of the cavity of the molding unit represents the size thereof measured approximately perpendicularly to the direction of the clamping motion of the dies of the molding unit.

Figure 8:
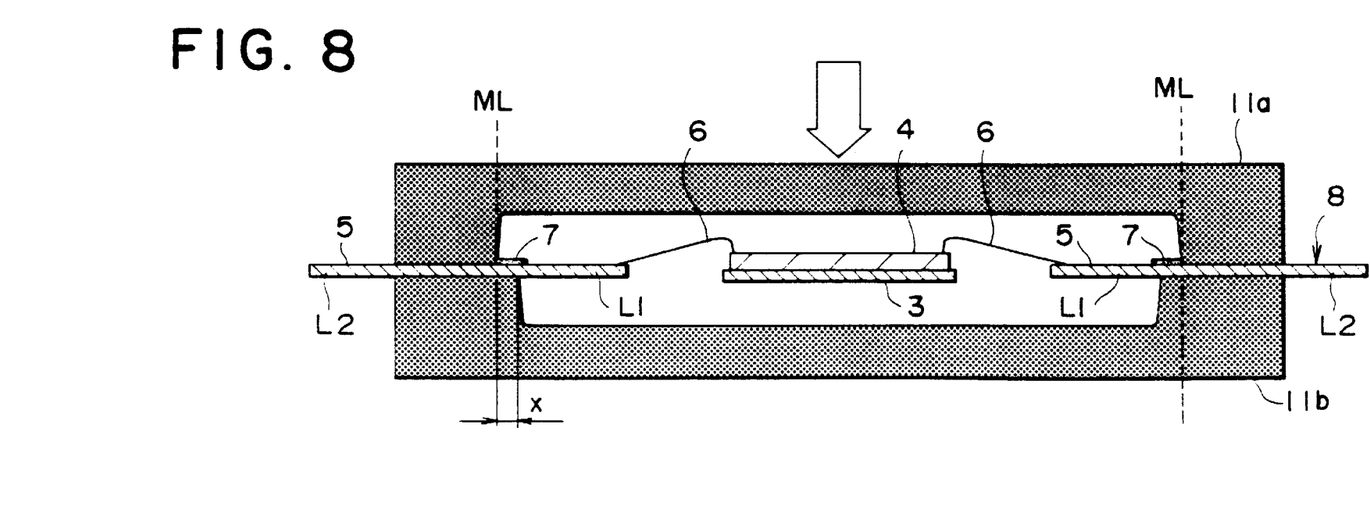
FIG. 8 is a cross-sectional view of a lead frame and an insulating strip, when the molding unit shown in FIG. 7 is in a clamped state.

Subsequently, as indicated in FIG. 8, the lower surface of the upper die 11a is closely brought into contact with the upper surface of the lower die 11b for a clamping operation. Then, that part of the dam tape 70 bonded to the upper surface of the leads 5 of the lead frame 8 which is outside the molding line ML is sandwiched between the upper die 11a and the leads 5 of the lead frame 8 to be crushed so that it is thrust into the spaces between adjacent leads 5 to form the dam, i.e. the filling material or filler 7' (FIG. 3). On the contrary, that part of the dam tape 70 which is inside the molding line ML remains on the upper surface of the leads 5 as the insulating strip 7.

At this clamping, the lower surface of the part of the leads 5 covered by the tape 70 is clamped by the lower die 11b, while the upper surface thereof is clamped by the upper die 11a through the soft tape 70. At this time, since there are positional deviations or displacement ("x" indicated in FIG. 8) between the inner end portion of the side walls of the upper die 11a and the inner end portion of the side walls of the lower die 11b, i.e. between the different recessed areas of the two dies, the inner lead portions L1 of the leads 5 are not bent downward. Under the condition that the abovementioned numerical values are used, it is verified that no bending of the leads 5 is produced, if these deviations (x) in the size are at least 0.2 mm–0.3 mm.

Then, molding material (molten resin) is injected into the cavity of the molding unit to mold the semiconductor chip 4. At this time, since the spaces between different leads 5 on the outer side of the mold line ML (on the outer side of the intermediate portions Li of the leads 5) are filled with a part of the tape 70 to form the dam, i.e. the filling material (filler) 7' (FIG. 3), molten resin will not flow out to the exterior of the molding unit through these spaces.

Figure 9:
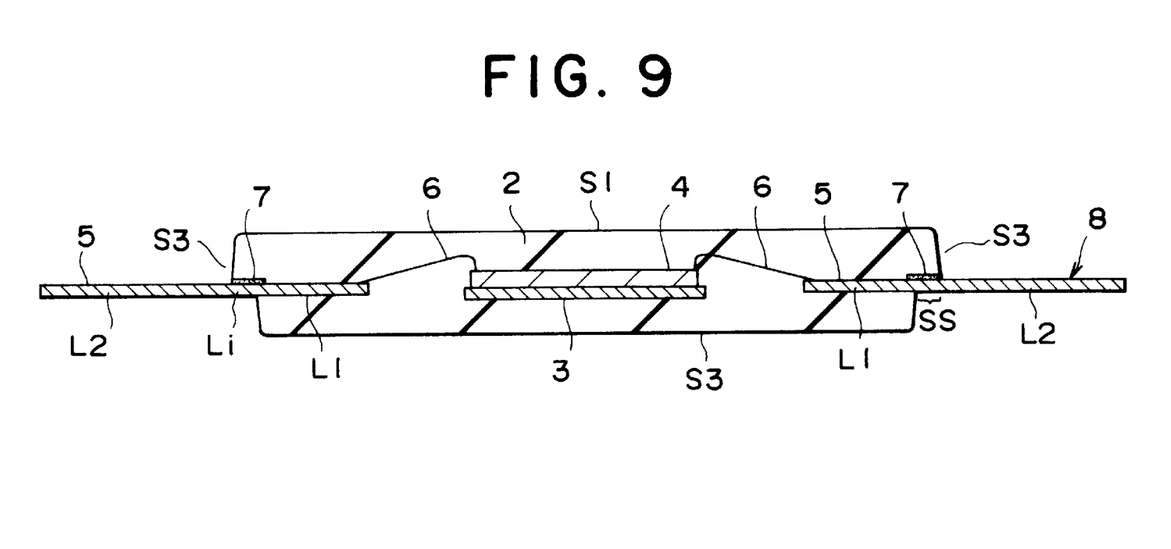
FIG. 9 is a cross-sectional view of a packaged semiconductor device obtained by the fabrication method shown in FIGS. 4 to 8.

Thereafter, when the lead frame 8 is taken out from the molding unit, a package 2 having different outer sizes on the upper side and the lower side of the leads 5, i.e. a flange on its side surface, as indicated in FIG. 9, is obtained owing to the differences of the recessed areas of the upper die 11a and the lower die 11b of the molding unit. The second portions (outer lead portions) L2 of the leads 5 protrude from the step portion SS of the side surface S3. On the other hand, the upper surface and the side surfaces of the intermediate portions Li between the first portions (inner lead portions) L1 and the second portions L2 are covered by the insulating strip 7 and the molding material 2, while the lower surface thereof is exposed.

Figure 10:
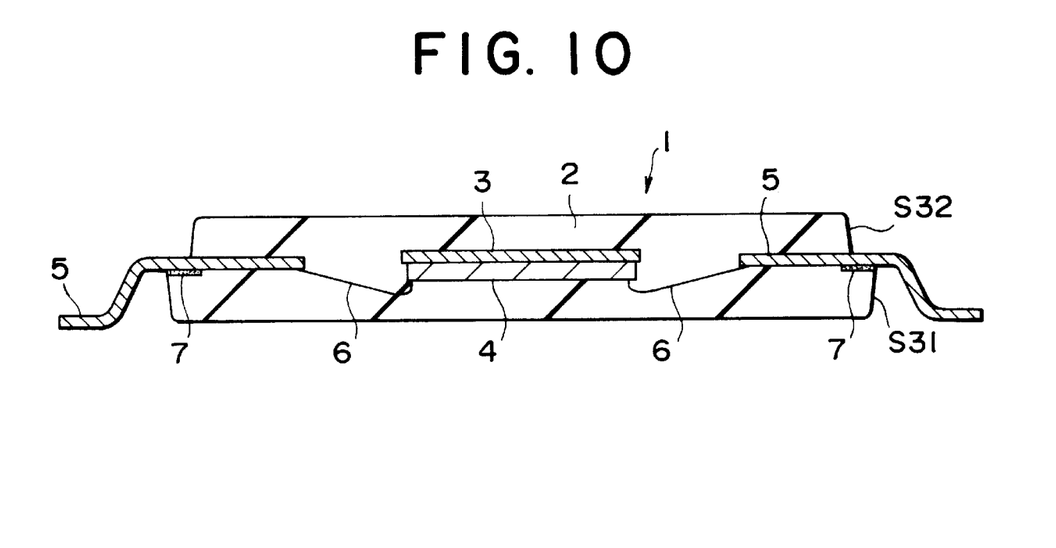
FIG. 10 is a cross-sectional view of a packaged semiconductor device obtained by shaping leads of the device shown in FIG. 9.

Then, after the outer lead portions L2 of the leads 5 have been subjected to solder plating treatment, unnecessary portions of the lead frame 8 are cut away by means of a press or the like. The QFP 1 indicated in FIG. 3 is completed by further bending (shaping) the leads 5 in a predetermined form. In case where the bending direction of the outer lead portions is reversed, the QFP 1 as indicated in FIG. 10 will be obtained.

As described above, according to the present embodiment, since it is possible to prevent efficiently bending of the inner leads at the clamping of the lead frame 8, to which the strip member 70 such as the dam tape is applied, by means of the molding unit, highly reliable QFPs 1 can be manufactured with a high yield.

Although a lead frame 8, to the upper surface of which a strip member 70 is applied, is used in the present embodiment, in case where a molding is effected with a lead frame to the lower surface of which the strip member 70 is applied, it is possible to prevent the inner lead portions of the leads 5 from bending in the (upward) direction opposite to the surface to which the strip member is applied, by using a molding unit in which the size (a) from one end of the inner side surface of the upper die to the other is smaller than the corresponding size (b) of the lower die. Further the surface of the leads to which the strip member 70 is applied, is not necessarily the surface of the leads to which the semiconductor chip 4 is bonded, but the strip member 70 may be applied to the surface of the leads to which the chip is not bonded, depending on the field of utilization.

Figure 11:
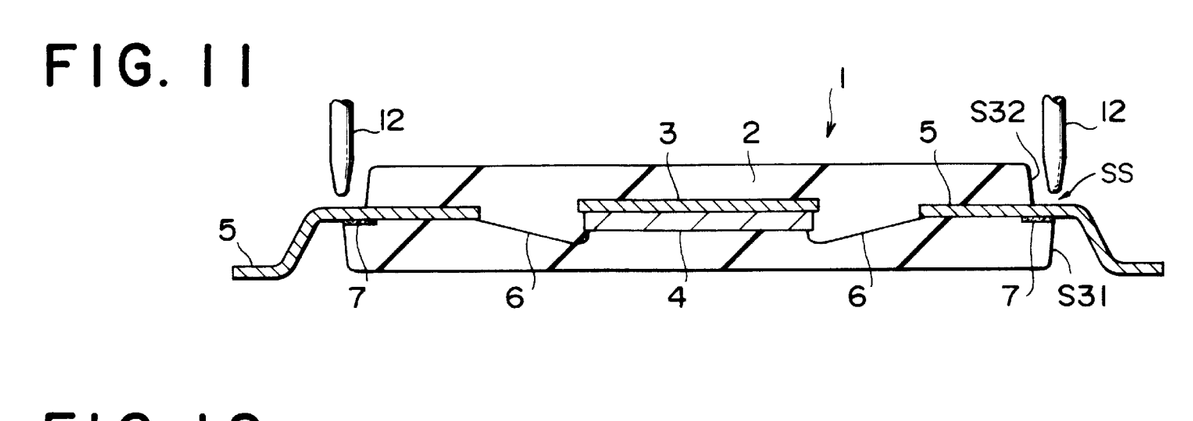
FIG. 11 is a cross-sectional view of a packaged semiconductor device indicating a state where it is under an electrical test.

Further, since the QFP 1 has different outer sizes on the upper half and the lower half sides of the mold package 2, electrical tests can be effected, e.g., by bringing probes 12 of a tester into contact with relevant leads 5 on the step portion SS connecting the side surface portions S31 and S32, as indicated in FIG. 11. In this way, since it is not necessary to bring the probes 12 into contact with readily deformable extremities of the leads 5, it is possible to prevent surely deformation of the leads 5 at electrical tests. Although FIG. 11 shows a QFP after the lead shaping, it is clear that a similar effect can be obtained also in case where electrical tests are effected before the lead shaping.

Figure 12:
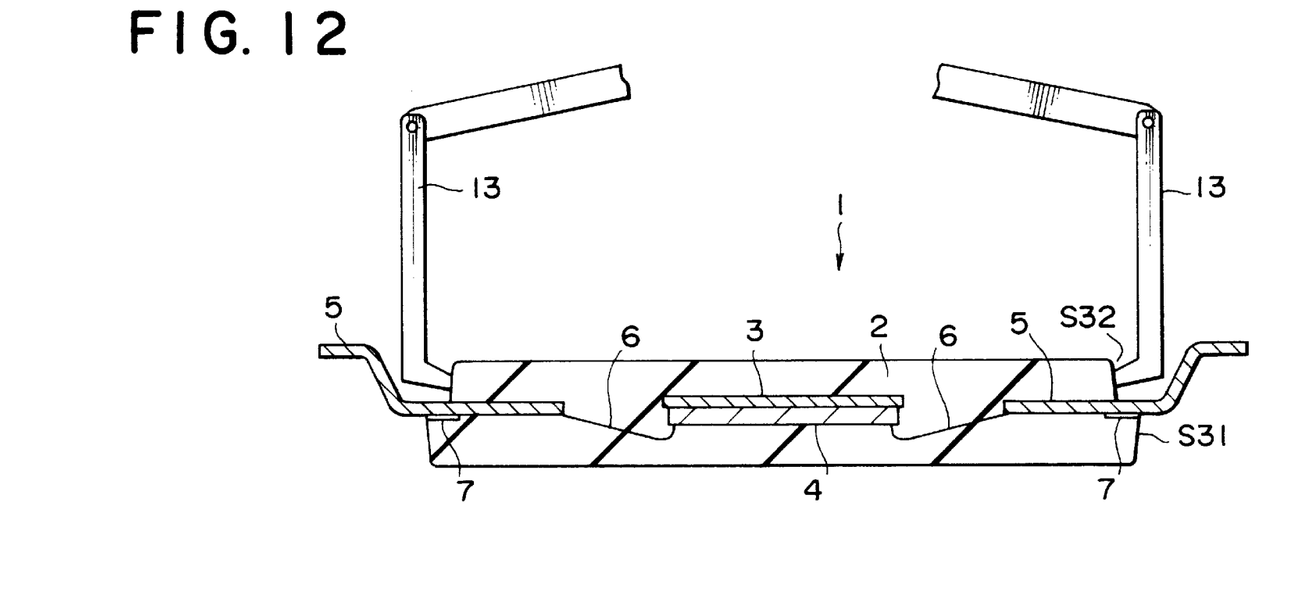
FIG. 12 is a cross-sectional view of a packaged semiconductor device indicating a state where it is being handled.

Further, when the QFP 1 is handled by using a jig 13 as indicated in FIG. 12, since it is easy to grasp the narrower (second) side surface portion S32 of the flanged side surface of the mold package 2 by means of the jig 13, handling and transportation of the QFP can be effected more conveniently.

Figure 13:
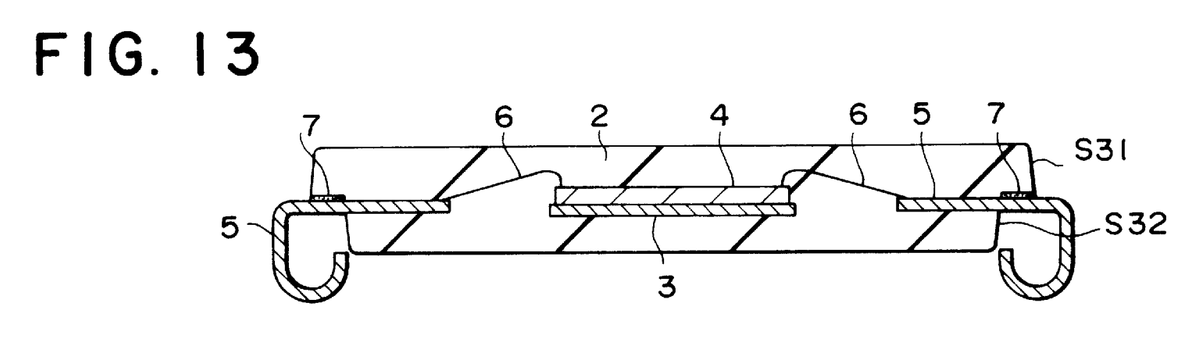
FIG. 13 is a cross-sectional view of a packaged semiconductor device according to another embodiment of the present invention.

In addition, in case where the leads 5 are bent in a J-shape, if they are bent so as to face the inner (second) side surface portion S32 of the flanged side surface of the mold package 2 as indicated in FIG. 13, since a protruding amount of the leads 5 in the transversal direction can be reduced with respect to that required in case where they are bent in the opposite direction, an area required for mounting the QFP 1 can be decreased.

Figure 14:
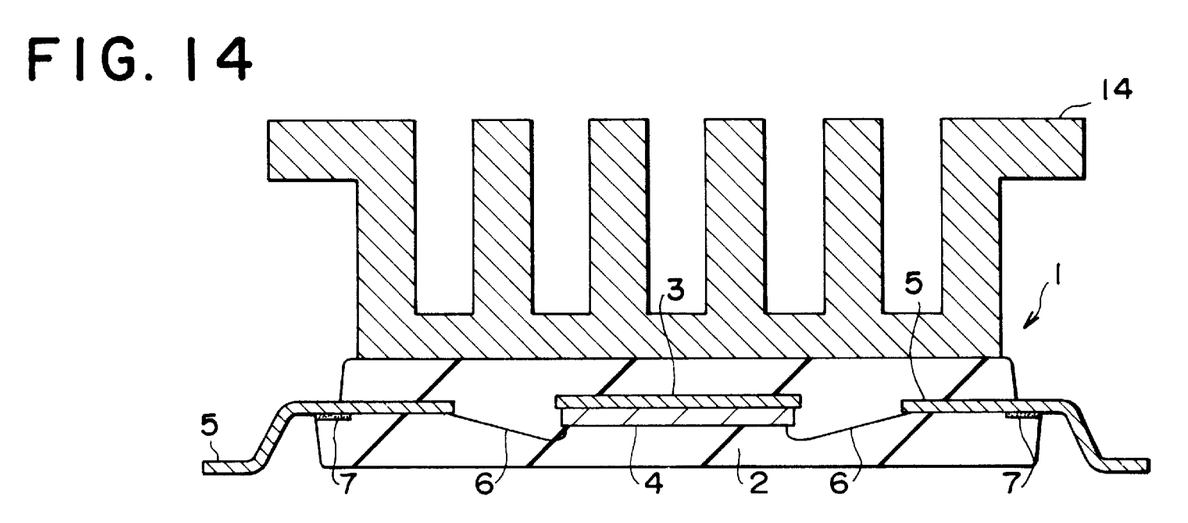
FIG. 14 is a cross-sectional view of a packaged semiconductor device according to another embodiment of the present invention.

Still further, as indicated in FIG. 14, since heat produced by the semiconductor chip 4 can be conducted to a heat radiator 14 through the die pad 3 by mounting the heat radiator 14 on the upper surface of the package mounted on a printed board, it is possible to provide a QFP 1 having a small thermal resistance.

Although the invention made by the inventors has been concretely explained in the above on the basis of the several preferred embodiments, the present invention is not restricted thereto, but it is a matter of course that various modifications can be made without departing from the scope thereof.

Although, in the above embodiments, the present invention has been explained in case where it is applied to manufacture of QFPS, the present invention can be applied to various sorts of LSI packages mounted on lead frames by the tape dam method.

We claim:

1. A method of manufacturing a packaged semiconductor device comprising the steps of:

providing a lead frame with an electrically insulating strip member, said lead frame having a chip mounting portion and a plurality of leads each having an inner lead portion to be sealed with a molding member and an outer lead portion to protrude from the molding member, said inner lead portion having a first end providing an area for electrical connection with a semiconductor chip, said leads being discontinuous from one another in the vicinity of a boundary line between said inner and outer lead portions, said electrically insulating strip member being adhered to one surface of said leads and being extended along said boundary line between said inner and outer lead portions;

bonding a semiconductor chip to said chip mounting portion of said lead frame, said semiconductor chip having a plurality of bonding pads formed on a main surface thereof;

electrically connecting said plurality of bonding pads of said semiconductor chip with said first ends of said inner lead portions by wire bonding, said first ends of said leads and said semiconductor chip being spaced from each other;

disposing said lead frame with said electrically insulating member and said semiconductor chip in a molding unit having an upper die and a lower die, said upper and lower dies having recessed areas which are of different sizes from each other and determine a size of a cavity of said molding unit, said size of said cavity being measured in a direction substantially perpendicular to a direction of a clamping motion of said dies, said lead frame with said electrically insulating member and said semiconductor chip being positioned such that said electrically insulating member is contacted with one of said upper and lower dies having a larger recessed area when said molding unit is closed and the other surface of said leads opposing to said one surface is contacted with the other of said upper and lower dies having a smaller recessed area and that an inner edge of said one of said upper and lower dies. corresponding to said boundary line, intersects said electrically insulating strip member, and said electrically insulating strip member has a first part inside said inner edge and a second part outside said inner edge, and a flat surface of the other of said upper and lower dies extends under said first part of said electrically insulating strip member;

closing said molding unit to clamp said lead frame and thrusting parts of said second part of said electrically insulating strip member into spaces between adjacent leads of said leads, while said first part of said electrically insulating strip member remains on said one surface of said leads; and injecting a molding material into said cavity of said molding unit to form said molding member sealing said semiconductor chip and said inner lead portions of said leads.

2. A method of manufacturing a packaged semiconductor device according to claim 1, wherein said parts of said electrically insulating strip member thrust into said spaces between said adjacent leads acts as a dam to prevent said molding material from hanging out of said cavity through said spaces between said adjacent leads.

3. Product formed by the method of claim 1.

4. A method for manufacturing a packaged semiconductor device according to claim 1, wherein a part of said electrically insulating strip member, inside a mold line of said molding unit when said molding unit is closed, remains on said one surface of said leads.

5. Product formed by the method of claim 4.

6. A method for manufacturing a packaged semiconductor device according to claim 1, wherein inner end portions of side walls of said one of said upper and lower dies are displaced from inner end portions of side walls of the other of the upper and lower dies.

7. A method for manufacturing a packaged semiconductor device according to claim 6, wherein a displacement between inner end portions of side walls of the one and the other of the upper and lower dies is at least 0.2 mm.

8. A method for manufacturing a packaged semiconductor device according to claim 6, wherein a projection of the inner end portions of side walls of said one of the upper and lower dies on a plane containing the lead frame, when said molding unit is closed, is outside of a projection of the inner end portions of side walls of the other of the upper and lower dies.

9. A method for manufacturing a packaged semiconductor device according to claim 1, wherein a size of said one of said upper and lower dies having a larger recessed area, in a direction from one end of an inner side wall to the other end of the inner side wall, is greater than a size of the other of the upper and lower dies in the direction from one end of the inner side wall to the other end of the inner side wall.

10. A method of manufacturing a packaged semiconductor device according to claim 1, wherein said flat surface of the other of said upper and lower dies extending under said first part of said electrically insulating strip member acts as a support to prevent said inner lead portions from bending, in the step of closing the molding unit to clamp said lead frame.

11. A method of manufacturing a packaged semiconductor device comprising the steps of:

providing a lead frame with an electrically insulating strip member, said lead frame having a chip mounting portion and a plurality of leads surrounding said chip mounting portion, each of said plurality of leads having an inner lead portion to be sealed with a molding member and an outer lead portion to protrude from the molding member, said inner lead portion having a first end providing an area for electrical connection with a semiconductor chip, said leads being discontinuous from one another in the vicinity of a boundary line between said inner and outer lead portions, said electrically insulating strip member being adhered to one surface of said leads and being extended along said boundary line between said inner and outer lead portions;

bonding a semiconductor chip to said chip mounting portion of said lead frame, said semiconductor chip having a plurality of bonding pads formed in a main surface thereof;

electrically connecting said plurality of bonding pads of said semiconductor chip with the first ends of said inner lead portions by wire bonding, said first ends of said leads and said semiconductor chip being spaced from each other;

disposing said lead frame with said electrically insulating strip member and said semiconductor chip in a molding unit having a first die and a second die, said first and second dies having recessed areas which are of different sizes from each other and determine a size of a cavity of said molding unit, said size of said cavity being measured in a first direction substantially perpendicular to a direction of a clamping motion of said first and second dies, each of said first and second dies having an upper flat surface for clamping said lead frame, and side and bottom surfaces for defining said recessed areas, said first die having a larger recessed area than that of said second die, said recessed area of said second die being positioned inside said recessed area of said first die in said first direction, said lead frame with said electrically insulating member and said semiconductor chip being positioned such that said electrically insulating strip member is contacted with said upper flat surface of said first die and the other surface of said leads opposing to said one surface is contacted with said upper flat surface of said second side and such that an inner edge of said first die, corresponding to said boundary line, intersects said electrically insulating strip member and said electrically insulating strip member has a first part inside said inner edge and a second part outside said inner edge, and said upper flat surface of said second die extends under said first part of said electrically insulating strip member;

closing said molding unit to clamp said lead frame and thrusting parts of said second part of said electrically insulating strip member into spaces between adjacent leads of said leads, while said first part of said electrically insulating strip member being remained on said one surface of said leads; and injecting a molding material into said cavity of said molding unit to form said molding member sealing said semiconductor chip and said inner lead portions of said leads.

12. A method of manufacturing a packaged semiconductor device according to claim 11, wherein parts of said second part of said electrically insulating strip member thrust into said spaces between said adjacent leads act as a dam to prevent said molding material from flowing out of said cavity through said spaces between said adjacent leads.

13. A method of manufacturing a packaged semiconductor device according to claim 11, wherein said upper flat surface of said second die extending under said first part of said electrically insulating strip member acts as a support to prevent said inner lead portions from bending, in the step of closing said molding unit to clamp said lead frame.

* * * * *